(12) United States Patent
Katoh

(10) Patent No.: US 7,876,119 B2
(45) Date of Patent: Jan. 25, 2011

(54) METHOD OF INSPECTING SEMICONDUCTOR DEVICE CHIP PATTERNS ON A WAFER

(75) Inventor: Takayuki Katoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1274 days.

(21) Appl. No.: 11/443,367

(22) Filed: May 31, 2006

(65) Prior Publication Data
US 2007/0105248 A1 May 10, 2007

(30) Foreign Application Priority Data
Nov. 4, 2005 (JP) .............................. 2005-321510

(51) Int. Cl.
*G01R 31/26* (2006.01)
*G01R 31/02* (2006.01)

(52) U.S. Cl. ............................ 324/762.02; 324/754.01; 324/756.03; 324/762.05; 438/15; 438/18

(58) Field of Classification Search ......... 324/754–765; 438/14–18
See application file for complete search history.

(56) References Cited

U.S. PATENT DOCUMENTS 5,014,003 A * 5/1991 Ishikawa ..................... 324/758
5,239,191 A * 8/1993 Sakumoto et al. ........... 257/203

FOREIGN PATENT DOCUMENTS

| JP | 02-105436 | 4/1990 |
|----|-----------|--------|
| JP | 07-037941 | 2/1995 |
| JP | 2004-079764 | 3/2004 |

* cited by examiner

*Primary Examiner*—Ha Tran T Nguyen
*Assistant Examiner*—Emily Y Chan
(74) *Attorney, Agent, or Firm*—Leydig, Voit & Mayer, Ltd.

(57) ABSTRACT

An inspection method includes performing an inspection by applying a probe to pads of a contact check pattern located, together with a chip pattern, on a wafer, and performing an inspection by applying the probe to pads of the chip pattern if a result of the inspection using the contact check pattern is within a predetermined range. A pattern having the same size as that of the chip pattern, differing in external appearance from the chip pattern, and having the same pads as those of the chip pattern is used as the contact check pattern.

3 Claims, 16 Drawing Sheets

METHOD OF INSPECTING SEMICONDUCTOR DEVICE CHIP PATTERNS ON A WAFER

BACKGROUND OF THE INVENTION

1. Field of the Invention

The present invention relates to a method of performing inspection by applying a probe to each of pads of a plurality of chip patterns formed on a wafer.

2. Background Art

A one hundred percent inspection is made of the frequency characteristics of ICs operating in a radiofrequency band, particularly ultrahigh-frequency-band ICs operating in a microwave region of 3 GHz or higher or monolithic microwave ICs (MMICs) operating in a higher millimeter wave region (30 to 300 GHz). This kind of inspection is performed by applying a probe to pads of a plurality of chip patterns formed on a wafer (see, for example, Japanese Patent Laid-Open No. 2-105436).

FIG. 15 is a plan view showing a conventional layout of chip patterns formed on a wafer. As shown in FIG. 15, identical chip patterns 1 are orderly laid out on the wafer. In each chip pattern 1 are formed transistor elements 2, DC bias application pads 3, an RF input pad 4, an RF output pad 5, a grounding pad 6a (on the input side) for on-wafer RF inspection, grounding pads 6b (on the output side) for on-wafer RF inspection, and via holes 7 for supply of ground potential.

FIG. 16 is a plan view showing a state when a one hundred percent inspection of the layout shown in FIG. 15 is started. Radiofrequency-band probe heads 8 having a G-S-G-type tip and DC probe cards 9 for application of DC biases are applied to the pads of the chip patterns 1 to make a direct-current inspection and a radiofrequency inspection (DC/RF inspections). The chip patterns 1 in the entire area on the wafer are inspected by moving the wafer stage in front-rear and left-right directions by a certain pitch.

FIG. 17 is a plan view showing the movement of the inspection position in a conventional method of one hundred percent inspection of high-frequency characteristics. FIG. 18 is a flowchart showing a conventional on-wafer one hundred percent inspection method.

In the conventional on-wafer one hundred percent inspection method, wafer alignment is first performed by making the X-Y coordinate angle of a wafer 13 and the X-Y coordinate angle of an inspection apparatus coincide with each other (step S101). Subsequently, a probe is brought into contact with the pads of the chip pattern 1 at an inspection start address (initial position) (step S102).

The probe is then moved to the chip pattern 1 at the next measurement address (step S103). The probe is reciprocated with respect to the X-coordinate and is moved in one direction with respect to the Y-coordinate. A direct-current inspection and a radiofrequency inspection (DC/RF inspections) are made on the chip pattern 1 (step S104).

If the present address is not the final address on the map, the process returns to step S103. If the present address is the final address, the inspection process ends (step S105).

FIG. 19 is a plan view showing the movement of the inspection position in a conventional method of one hundred percent inspection of high-frequency characteristics with respect to temperature. FIG. 20 is a flowchart showing the conventional method of one hundred percent inspection of high-frequency characteristics with respect to temperature.

Inspection is performed by applying a probe to pads of a plurality of chip patterns on the wafer on the basis of a map file indicating the positions of the chip patterns on the wafer. The size of the wafer 13 expands/contracts slightly according to the environmental temperature. As long as only one map file is used, an error occurs in the movement-destination position when the environmental temperature is changed, resulting in contact failure. In the conventional method of one hundred percent inspection of high-frequency characteristics with respect to temperature, therefore, map files indicating slight changes in size related to different temperatures are prepared and loaded on a temperature-by-temperature basis (step S121).

The temperature of the wafer stage is then set (step S122). A contact check is made on certain chip patterns 1 on the wafer 13 (step S123).

A direct-current inspection and a radiofrequency inspection (DC/RF inspections) are made on all the chip patterns 1 (step S124).

If the measurement through the entire temperature range has not been completed, the process returns to step S121. If the measurement through the entire temperature range has been completed, the inspection process ends (step S125).

FIG. 21 is a diagram schematically showing a conventional RF energization inspection system. A radiofrequency signal source 18 is connected to an input end of a device 22 to be measured, via a driver 19, a variable attenuator 20 and an isolator 21. Also, a DC power supply 24 is connected to the device 22 to be measured. A power meter 23 is connected to an output end of the device 22 to be measured, via an isolator 21.

FIG. 22 is a flowchart showing a conventional RF energization inspection method in which an RF output measurement interrupt is produced at certain intervals. In this inspection method, an RF signal generated from the radiofrequency signal source 18 is level-adjusted by the variable attenuator 20 and input to the device (DUT) 22 to be measured, while DC biases are being applied from the DC power supply 24 to the device 22 to be measured (step S141). The device 22 to be measured is left in this state for a certain time period (step S142).

The DC current and RF output power are monitored with the power meter 23 and recorded (step S143). If the measured device 22 is out of order, the inspection process ends. If the measured device 22 is not out of order, the process advances to step S145 (step S144). Further, if a programmed total time has not lapsed, the process returns to step S142. If the programmed total time has lapsed, the inspection process ends (step S145).

FIG. 23 is a diagram showing input power $P_{in}$, and output power $P_{out}$ of the amplifier. As shown in FIG. 23, the amplifier has a linear region in which the gain is constant even when input power $P_{in}$ is increased, and a saturation region in which the gain is reduced when input power $P_{in}$ is increased. Output power $P_{out}$ when the gain is reduced by N dB (N=1, 2, 3 . . . ) than that in the linear region, and which is used as an index to indicate a characteristic of the amplifier, will be referred to as N dB gain compression point output ($P_{NdB}$).

FIG. 24 is a flowchart showing a conventional N dB gain compression point output inspection method. In the conventional inspection method, RF power is first turned off (step S141) and DC biases are applied (step S142). Input power $P_{in}$ (A dB) which is certainly within the linear region is then given and a linear gain L=(B−A) dB is determined from the corresponding output power $P_{out}$ (B dB) (step S143).

Input power $P_{in}$ higher than J dB than the preceding input is thereafter given and output power $P_{out}$ is measured to determine the power gain (step S144). Examination is made as to whether or not the DUT is operating correctly (step S142). If the DUT is operating correctly, the process advances to step S146. If the DUT is not correctly operating, the process moves to step S149.

Examination is then made as to whether or not the power gain is lower by 1 dB or more than the linear gain (step S146). If the power gain is not lower by 1 dB or more than the linear gain, the process returns to step S144 and the input level is stepped up. If the power gain is lower by 1 dB or more, the process advances to step S147 without stepping up the input power $P_{in}$.

The 1 dB gain compression point output (P1 dB) is thereafter computed by linear approximation or input power $P_{in}$ step-down adjustment (step S147). Determination of the computed 1 dB gain compression point output by comparison with the standard value is then made (step S148). Thereafter, the RF power is turned off, the DC biases are turned off and the inspection process ends (step S149).

When one hundred percent inspection of chip patterns formed on a wafer is executed, there is a need to select the chip pattern at a particular address and to bring the probe head into contact with the selected chip pattern. In a case where identical ship patters are orderly laid out on a wafer as in the conventional art, there is a possibility of a chip pattern at an address different from the target address being probed. Even when the chip pattern at the target address is probed, there is a problem that contact failure may occur due to variation in thickness or warp of the wafer.

On a large-diameter wafer, an X-Y coordinate angle error θ becomes larger at a position closer to a wafer end. Therefore the conventional on-wafer one hundred percent inspection method entails a possibility of contact failure due to error θ at a wafer peripheral portion even if there is no problem with contact at a particular initial position (ordinarily a position at a wafer center). Thus, there is a problem that losses of time and hardware may occur.

The conventional method of one hundred percent inspection of high-frequency characteristics with respect to temperature requires preparation of different map files with respect to measurement temperatures, and has a problem that there is a need to newly prepare a map file in a case where a measurement is tried at an unforeseen temperature.

The conventional RF energization inspection method enables monitoring of only RF output power from a device to be measured with respect to RF input power to one point and therefore has a problem that variations in characteristics in a plurality of power level regions such as a linear region and a non-linear region cannot be detected.

The conventional gain compression point output inspection method requires execution of measurement of input power $P_{in}$ at least at 10 points and therefore has a problem that a considerably long time (one minute or longer) is required for inspection of one chip.

SUMMARY OF THE INVENTION

The present invention has been achieved to solve the above-described problems, and a first object of the present invention is to provide a semiconductor device inspection method which ensures that inspection of chip patterns formed on a wafer can be easily performed with accuracy.

A second object of the present invention is to provide a semiconductor device inspection method which presents contact failure.

A third object of the present invention is to provide a semiconductor device inspection method which does not require preparation of a map file with respect to each of measurement temperatures.

A fourth object of the present invention is to provide a semiconductor device inspection method which enables monitoring of RF output power from a device to be measured with respect to a plurality of instances of RF input power.

A fifth object of the present invention is to provide a semiconductor device inspection method which ensures that inspection of a gain compression point output can be performed in a short time.

According to one aspect of the present invention as set forth in claim 1, a method of inspecting a semiconductor device includes a step of performing inspection by applying a probe to pads of a contact check pattern formed together with a chip pattern on a wafer, and a step of performing inspection by applying the probe to pads of the chip pattern if a result of the inspection on the contact check pattern is within a predetermined range. A pattern having the same size as that of the chip pattern, differing in external appearance from the chip pattern and having the same pads as those of the chip pattern is used as the contact check pattern.

According to one aspect of the present invention as set forth in claim 2, a method of inspecting a semiconductor device in which inspection is performed by applying a probe to pads of a plurality of chip patterns formed on a wafer, the method includes the step of applying the probe to the pads of one of chip patterns formed on a wafer outer peripheral portion after execution of wafer alignment, the step of redoing wafer alignment if a contact failure is recognized, and the step of performing radiofrequency inspection by applying the probe to the pads of the plurality of chip patterns if no contact failure is recognized.

According to one aspect of the present invention as set forth in claim 3, a method of inspecting a semiconductor device in which inspection is performed by applying a probe to pads of a plurality of chip patterns formed on a wafer, the method includes a step of loading a map file indicating the positions of the plurality of chip patterns on the wafer, a step of correcting the map file according to the temperature of the wafer, a step of performing radiofrequency inspection by applying the probe to the pads of the plurality of chip patterns on the basis of the corrected map file.

According to one aspect of the present invention as set forth in claim 4, a method of inspecting a semiconductor device includes a step of applying predetermined RF input power to a device to be measured; and a step of temporarily stopping application of the predetermined RF input power, applying a plurality of RF input powers to the device to be measured, and monitoring RF output power with respect to each RF input power.

According to one aspect of the present invention as set forth in claim 5, a method of inspecting a semiconductor device in which an N dB gain compression point output (N=1, 2, 3 . . . ) from an amplifier having a certain standard value X dBm is inspected, the method includes a step of deriving a linear gain L dB from a measurement of an input and output in a linear region, inputting input power of X−(L−N) dBm and a step of determining the device as a non-defective if the output power is higher than X dBm.

The invention as set forth in claim 1 in the attached claims enables chip patterns formed on a wafer to be easily inspected with accuracy.

The invention as set forth in claim 2 enables prevention of contact failure.

The invention as set forth in claim 3 eliminates the need for preparation of a map file with respect to each of measurement temperatures.

The invention as set forth in claim 4 enables monitoring of RF output power from a device to be measured with respect to a plurality of instances of RF input power.

The invention as set forth in claim 5 enables inspection of a gain compression point output to be performed in a short time.

Other and further objects, features and advantages of the invention will appear more fully from the following description.

DETAILED DESCRIPTION OF THE PREFERRED EMBODIMENTS

First Embodiment

Figure 1:
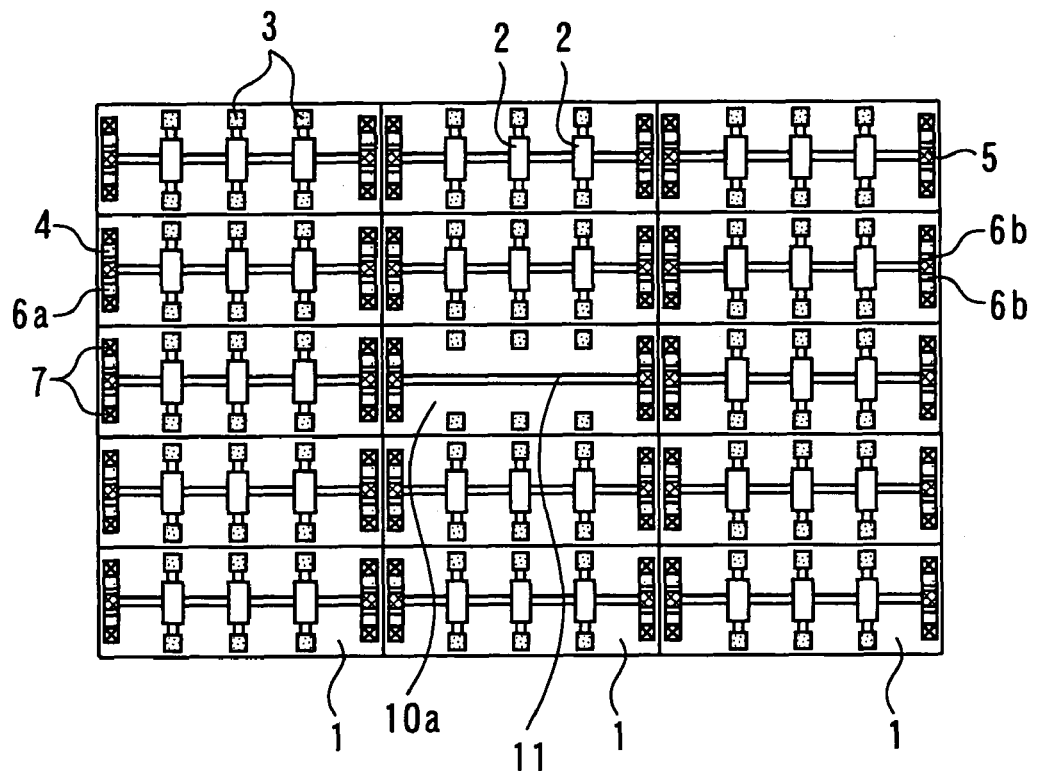
FIG. 1 is a plan view a layout of chip patterns formed on a wafer.

FIG. 1 is a plan view showing a layout of chip patterns formed on a wafer according to a first embodiment of the present invention. As shown in FIG. 1, identical chip patterns 1 are orderly laid out on the wafer. In each chip pattern 1 are formed transistor elements 2, DC bias application pads 3, an RF input pad 4, an RF output pad 5, a grounding pad 6a (on the input side) for on-wafer RF inspection, grounding pads 6b (on the output side) for on-wafer RF inspection, and via holes 7 for supply of ground potential. The grounding pads 6a and 6b are connected to a grounding conductor on the backside through adjacent via holes 7.

A contact check pattern 10a is formed in several places on the wafer along with the chip patterns 1. The contact check pattern 10a is equal in size to the chip pattern 1, differs in external appearance from the chip pattern 1, and has pads in the same pattern as the pattern in which the pads of the chip pattern 1 are provided. A transmission line 11 for connection between the input and output pads is formed in the contact check pattern 10a.

Figure 2:
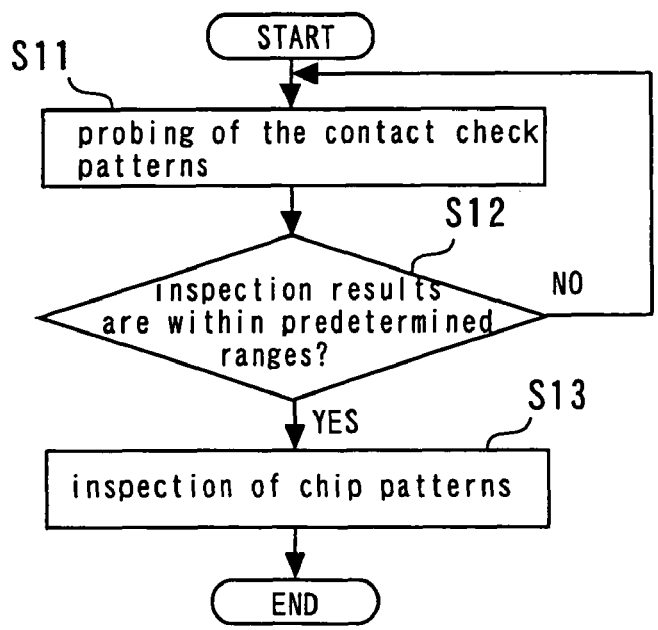
FIG. 2 is a flowchart showing a semiconductor inspection method according to a first embodiment of the present invention.
Figure 3:
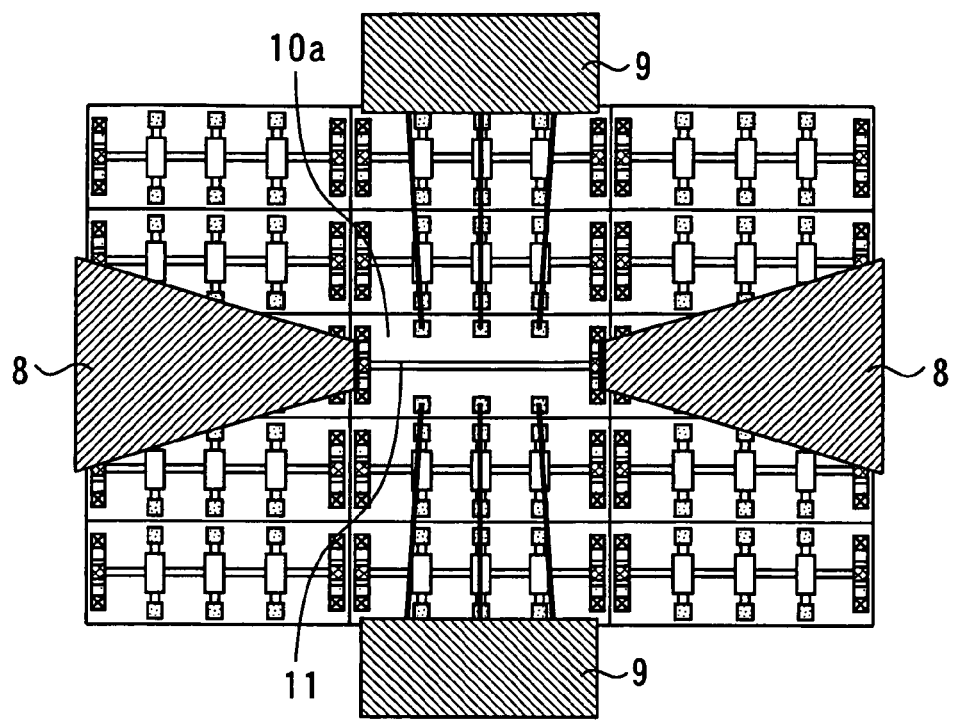
FIG. 3 is a plan view showing a situation before execution of one hundred percent inspection of chip patterns.

A wafer inspection method using the above-described chip layout will be described with reference to the flowchart of FIG. 2. Before execution of one hundred percent inspection of chip patterns 1 as shown in FIG. 3, a direct-current inspection and a radiofrequency inspection (DC/RF inspections) are made on the contact check pattern 10a in one place or a plurality of places on the wafer by applying radiofrequency-band probe heads 8 and DC probe cards 9 to the pads of the contact check patterns 10a (step S11).

Determination is made as to whether or not the results of the inspections are within predetermined ranges (step S12). If the results of the inspections are not within the predetermined ranges, the process returns to step S11 to redo contact adjustment. If the results of the inspections are within the predetermined ranges, the direct-current inspection and the radiofrequency inspection (DC/RF inspections) are made on one of on the chip patterns 1 by applying the radiofrequency-band probe heads 8 and the DC probe cards 9 to the pads of the chip pattern 1. The chip patterns 1 in the entire area on the wafer are inspected by moving the wafer stage in front-rear and left-right directions by a certain pitch (step S13).

The electrical characteristics of each of the transmission lines 11 in the contact check patterns 10a can be simulated with comparatively high accuracy and variations in characteristics at the time of making of the contact check patterns 10a are small. For this reason, it is possible to determine that there is a contact problem if a passage loss equal to or higher than a certain value is obtained through one contact check pattern 10a. Therefore the chip patterns 1 can be inspected with accuracy if the contact check patterns are inspected before one hundred percent inspection of the chip patterns 1. Since the contact check patterns 10a differ in external appearance from the chip patterns 1, it is possible to select each of the contact check patterns 10a without confusing it with any of the chip patterns 1 and to bring the probe head into contact with the selected check pattern 10a.

Figure 4:
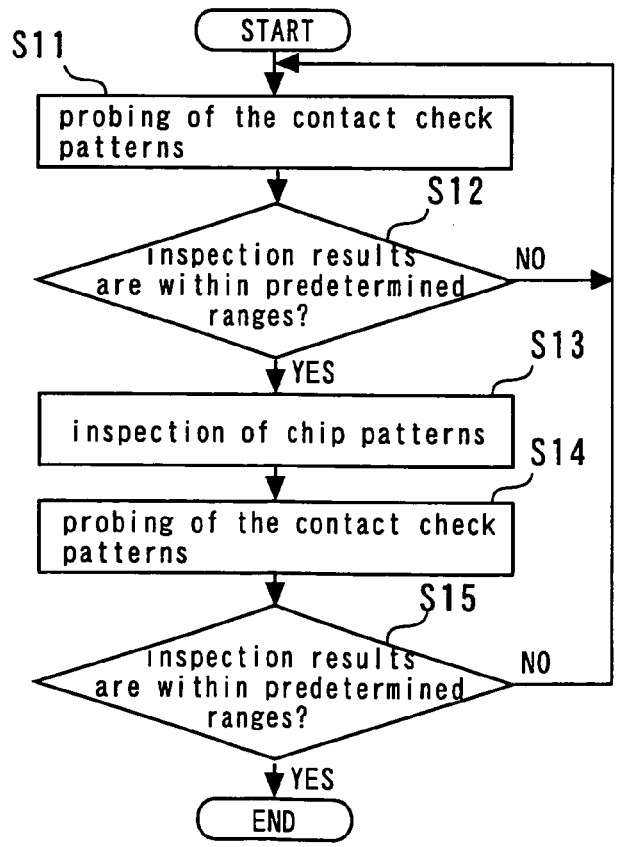
FIG. 4 is a flowchart showing another semiconductor inspection method according to the first embodiment.

FIG. 4 is a flowchart showing another semiconductor inspection method according to the first embodiment. Steps S11, S12, and S13 are the same as those in the above-described process. After one hundred percent inspection of the chip patterns, the direct-current inspection and the radiofrequency inspection (DC/RF inspections) are made on the contact check pattern 10a in one place or a plurality of places on the wafer (step S14). Determination is made as to whether or not the results of the inspections are within the predetermined ranges (step S15). If the results of the inspections are not within the predetermined ranges, it is determined that some fault has occurred during the one hundred percent inspection, the process returns to step S11 to redo contact adjustment. If the results of the inspections are within the predetermined ranges, the inspection process ends.

Figure 5:
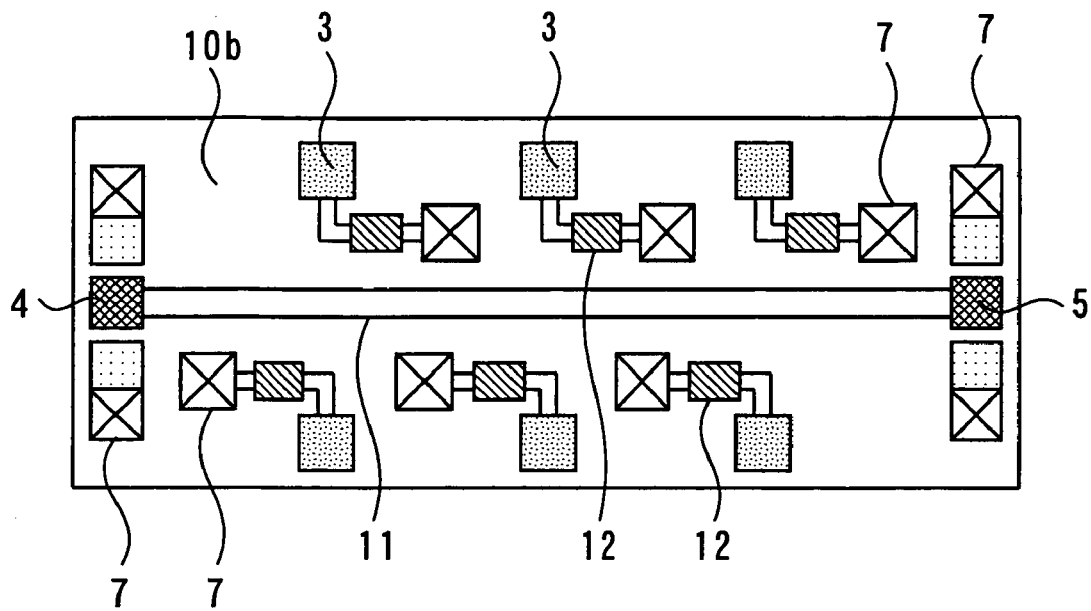
FIG. 5 is a plan view showing another example of contact check patterns.

FIG. 5 is a plan view showing another example of contact check patterns. This contact check pattern 10b has resistor patterns 12 connecting the DC bias application pads 3 and the via holes 7 for supplying ground potential in addition to the elements of the contact check pattern 10a shown in FIG. 1.

Figure 6:
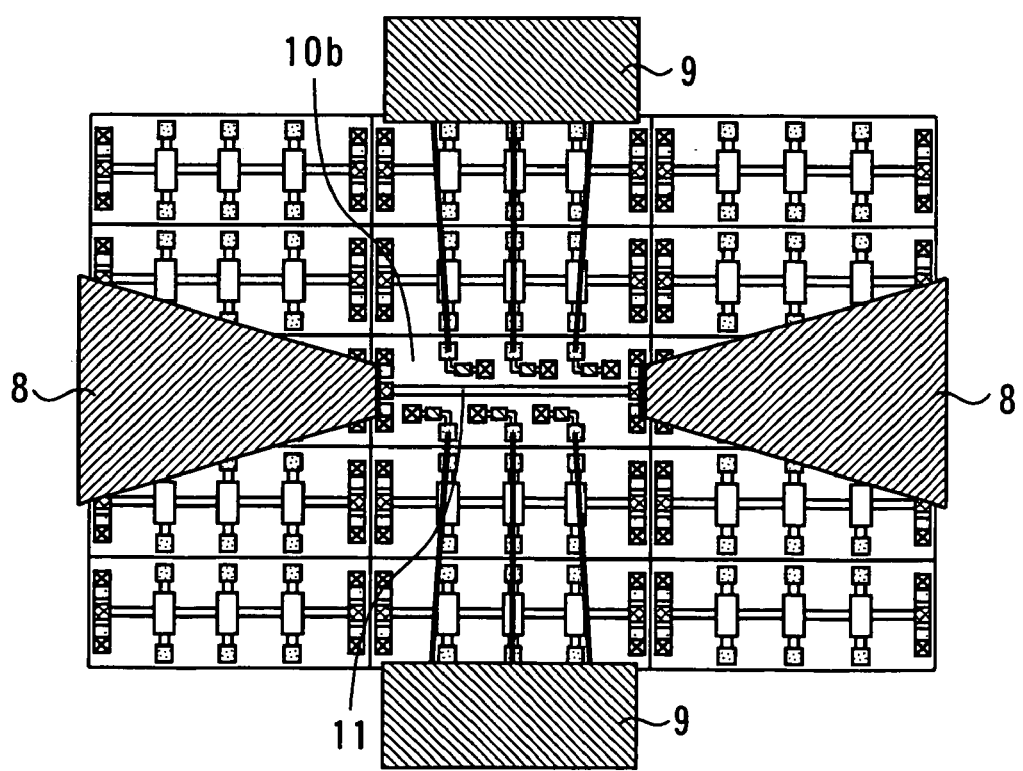
FIG. 6 is a plan view showing a state when one-hundred percent inspection of a layout including the contact check pattern shown in FIG. 5 is started.

FIG. 6 is a plan view showing a state when one-hundred percent inspection of a layout including the contact check pattern shown in FIG. 5 is started. Radiofrequency probe head 8 contact failure can be detected in the same way as in the above-described example. In this case, however, it is also possible to detect DC probe card 9 contact failure. That is, if a detection result indicates that the resistance value of one of the DC pads is equal to or larger than a certain value, it is possible to determine that the DC probe card 9 has contact failure.

Second Embodiment

Figure 7:
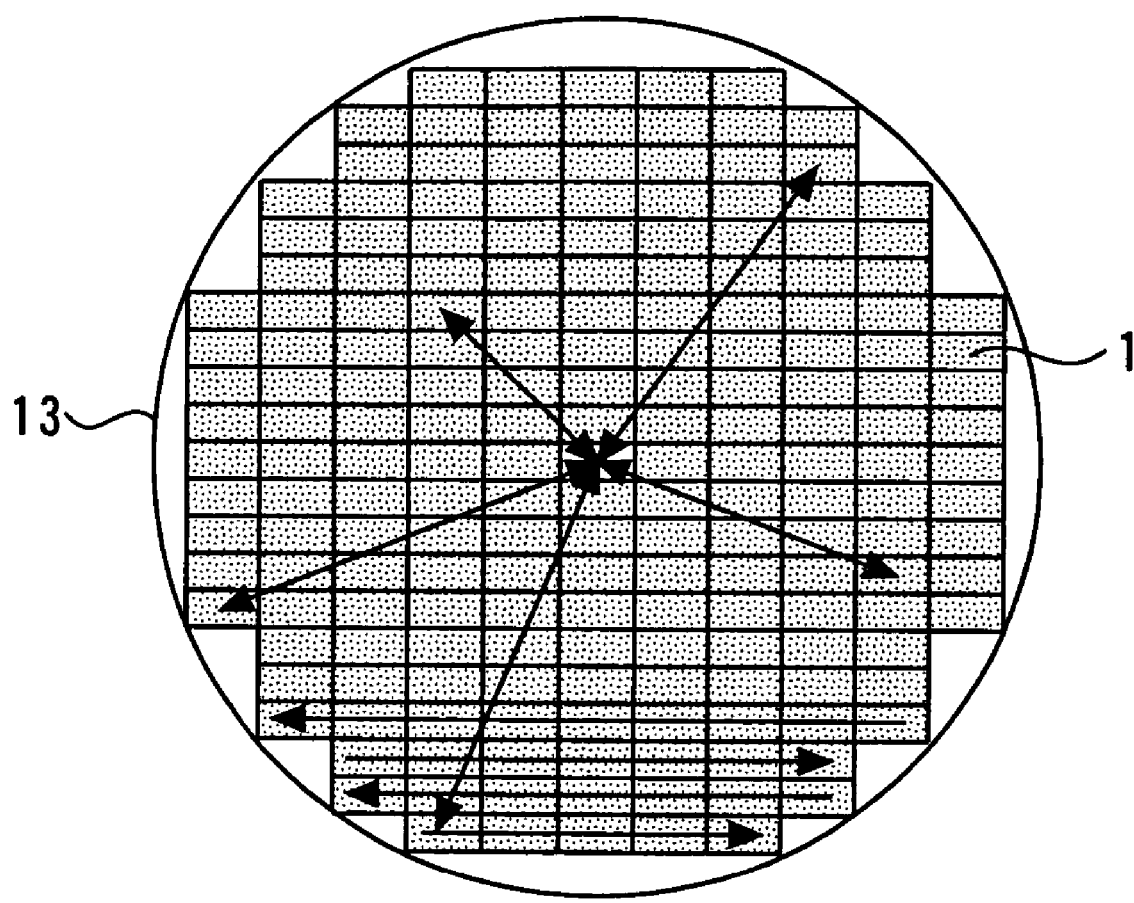
FIG. 7 is a plan view showing the movement of the inspection position in a semiconductor device inspection method according to a second embodiment of the present invention.
Figure 8:
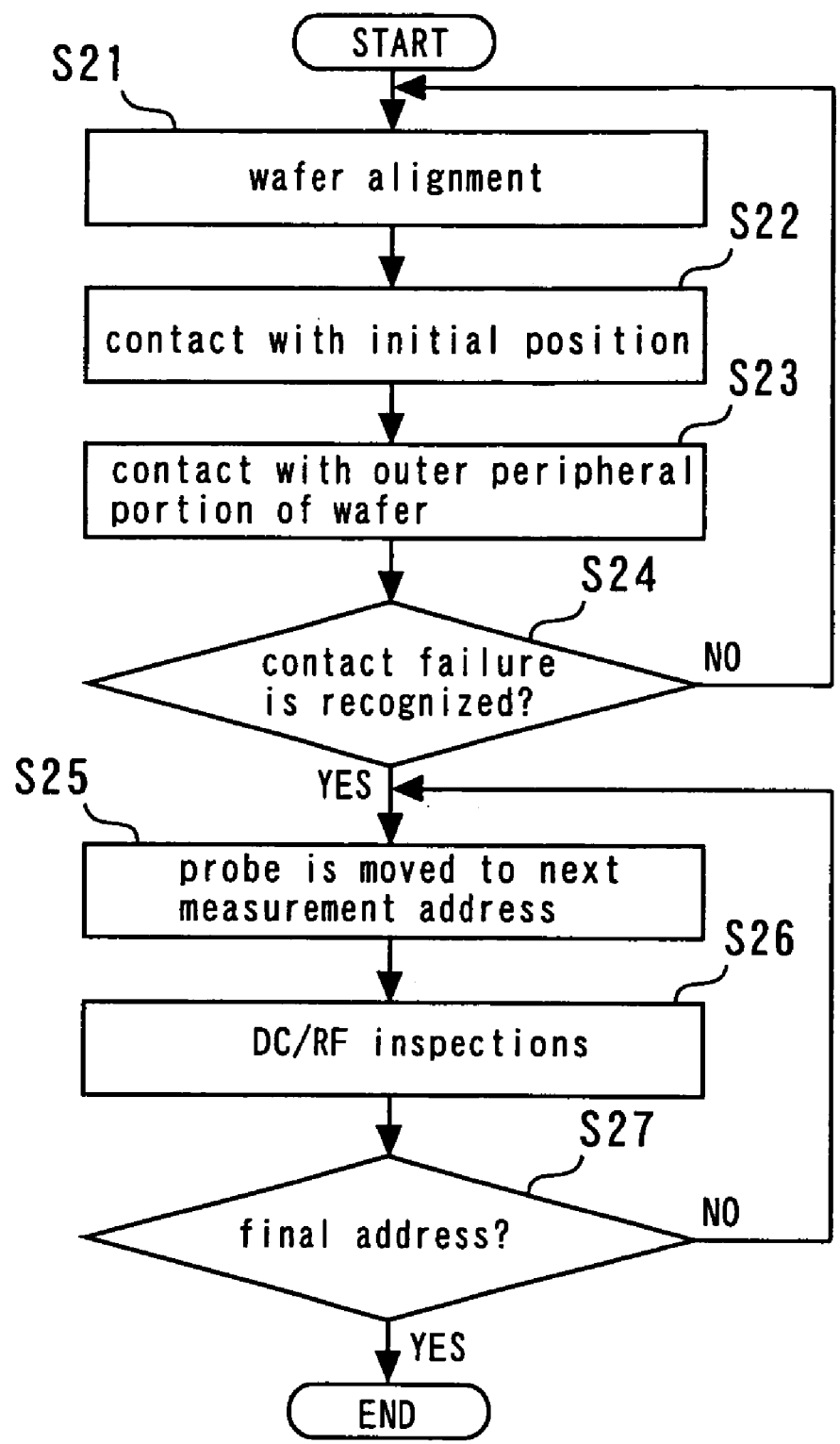
FIG. 8 is a flowchart showing the semiconductor device inspection method according to the second embodiment of the present invention.

FIG. 7 is a plan view showing the movement of the inspection position in a semiconductor device inspection method according to a second embodiment of the present invention. FIG. 8 is a flowchart showing the semiconductor device inspection method according to the second embodiment of the present invention.

In the semiconductor device inspection method according to the second embodiment, wafer alignment is first performed by making the X-Y coordinate angle of a wafer 13 and the X-Y coordinate angle of an inspection apparatus coincide with each other (step S21). Subsequently, the probe is brought into contact with the pads of the chip pattern 1 at an inspection start address (initial position) (step S22).

The probe is then brought into contact with the pads of the chip pattern 1 formed on an outer peripheral portion of the wafer (step S23). Preferably, contact is checked with respect to a plurality of points on the periphery of the wafer. If contact failure is recognized, the process returns to step S21 to redo wafer alignment. If no contact failure is recognized, the process advances to step S25 (step S24).

Subsequently, the probe is moved to the chip pattern 1 at the next measurement address (step S25). The probe is reciprocated with respect to the X-coordinate and is moved in one direction with respect to the Y-coordinate. The direct-current inspection and the radiofrequency inspection (DC/RF inspections) are made on the chip pattern 1 (step S26).

If the present address is not the final address on the map, the process returns to step S25. If the present address is the final address, the inspection process ends (step S27).

Contact is checked at a wafer outer peripheral portion at which the coordinate angle error θ is maximized to ensure contact at all the addresses on the wafer, thus preventing contact failure.

Third Embodiment

Figure 9:
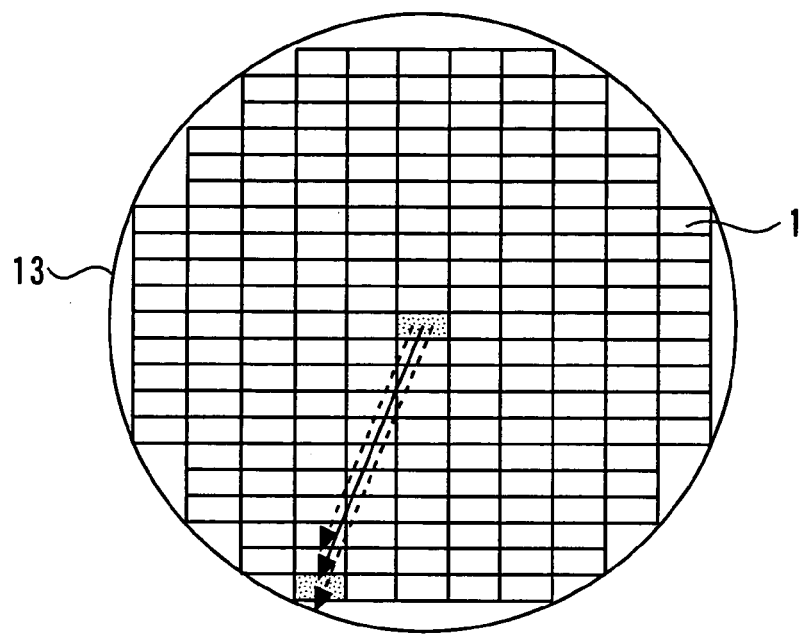
FIG. 9 is a plan view showing the movement of the inspection position in a semiconductor device inspection method according to a third embodiment of the present invention.
Figure 10:
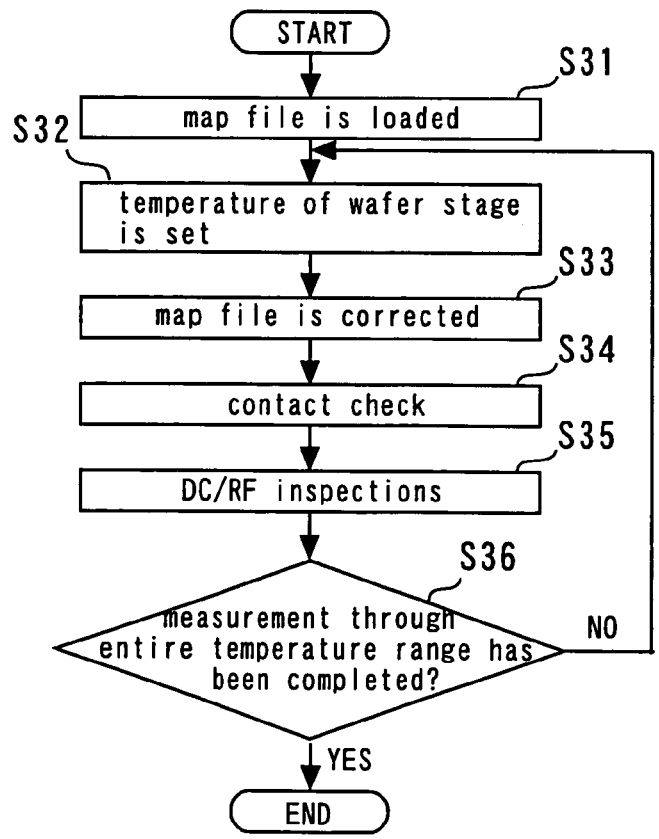
FIG. 10 is a flowchart showing the semiconductor device inspection method according to the third embodiment of the present invention.

FIG. 9 is a plan view showing the movement of the inspection position in a semiconductor device inspection method according to a third embodiment of the present invention. FIG. 10 is a flowchart showing the semiconductor device inspection method according to the third embodiment of the present invention.

In the semiconductor device inspection method according to the third embodiment, a map file to be used in common through to the entire temperature range is first prepared and loaded (step S31).

The temperature of the wafer stage is set (step S32). The map file is automatically corrected in the control system according to the temperature of the wafer (step S33). The temperature of the wafer may be manually input by a user. However, it is preferable to automatically input the temperature from a thermometer or a temperature controller. Contact check is performed with respect to predetermined chip patterns 1 on the wafer 13 (step S34).

The direct-current inspection and the radiofrequency inspection (DC/RF inspections) are made on all the chip pattern 1 on the basis of the corrected map file (step S35). If the measurement through the entire temperature range has not been completed, the process returns to step S32. If the measurement through the entire temperature range has been completed, the inspection process ends (step S36).

As described above, a map file is corrected according to the temperature of the wafer, and there is no need to prepare with respect to each of measurement temperatures.

Fourth Embodiment

Figure 11:
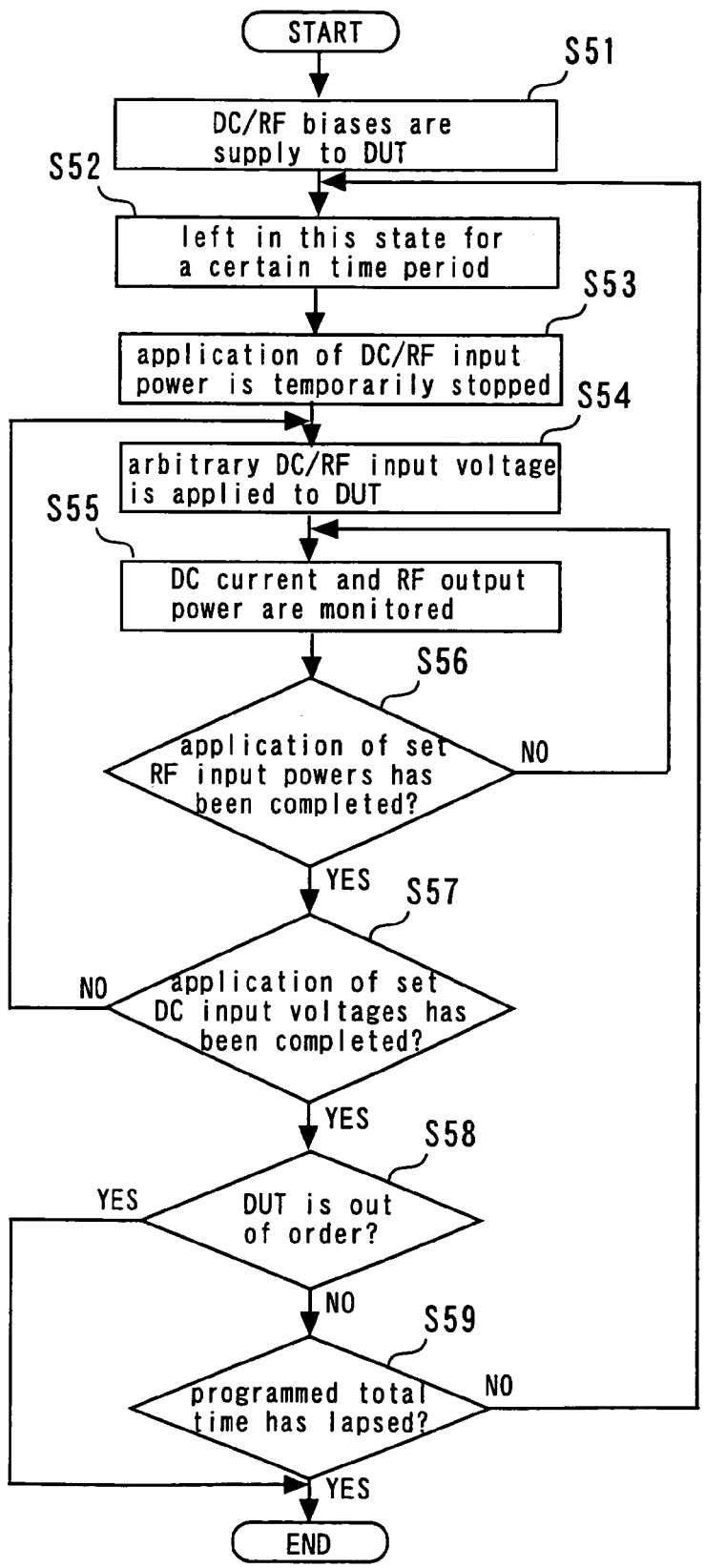
FIG. 11 is a flowchart showing a semiconductor device inspection method according to a fourth embodiment of the present invention.

FIG. 11 is a flowchart showing a semiconductor device inspection method according to a fourth embodiment of the present invention. In this inspection method, predetermined RF input power generated from a radiofrequency signal source is level-adjusted by a variable attenuator and input to a device (DUT) to be measured, while predetermined DC biases being applied from a DC power are supply to the device to be measured (step S51). The device to be measured is left in this state for a certain time period (step S52).

Thereafter, interrupt processing is performed at predetermined internals on the device to be measured in the energized state. That is, application of the DC input voltage and the RF input power is temporarily stopped (step S53). Subsequently, an arbitrary DC input voltage is applied to the device to be measured (step S54), and arbitrary RF input power is applied to the device to be measured. The DC current and RF output power are monitored with a power meter 23 and recorded (step S55). If application of set RF input powers has been completed, the process advances to step S57. If application of the set RF input powers has not been completed, the process returns to step S55 (step S56). If application of set DC input voltages has been completed, the process advances to step S58. If application of the set DC input voltages has been completed, the process returns to step S54 (step S57). Each of these loops is repeated the number of times corresponding to the number of set DC input voltages or set RF input powers.

Part of the RF input powers at the time of interrupt processing may be the same as the value in the energized state. A single RF input power value may alternatively be set. Also, part of the DC input voltages may be the same as the value in the energized state. A single DC input voltage value may alternatively be set.

If the measured device is out of order, the inspection process ends. If the measured device is not out of order, the process advances to step S59 (step S58). Further, if a programmed total time has not lapsed, the process returns to step S58. If the programmed total time has lapsed, the inspection process ends (step S59).

As described above, application of predetermined RF input power is temporarily stopped, a plurality of RF input powers are then applied to the device to be measured, and the RF output power is monitored with respect to each input. In this way, RF output power from the device to be measured can be monitored with respect to a plurality of RF input powers.

Fifth Embodiment

Figure 12:
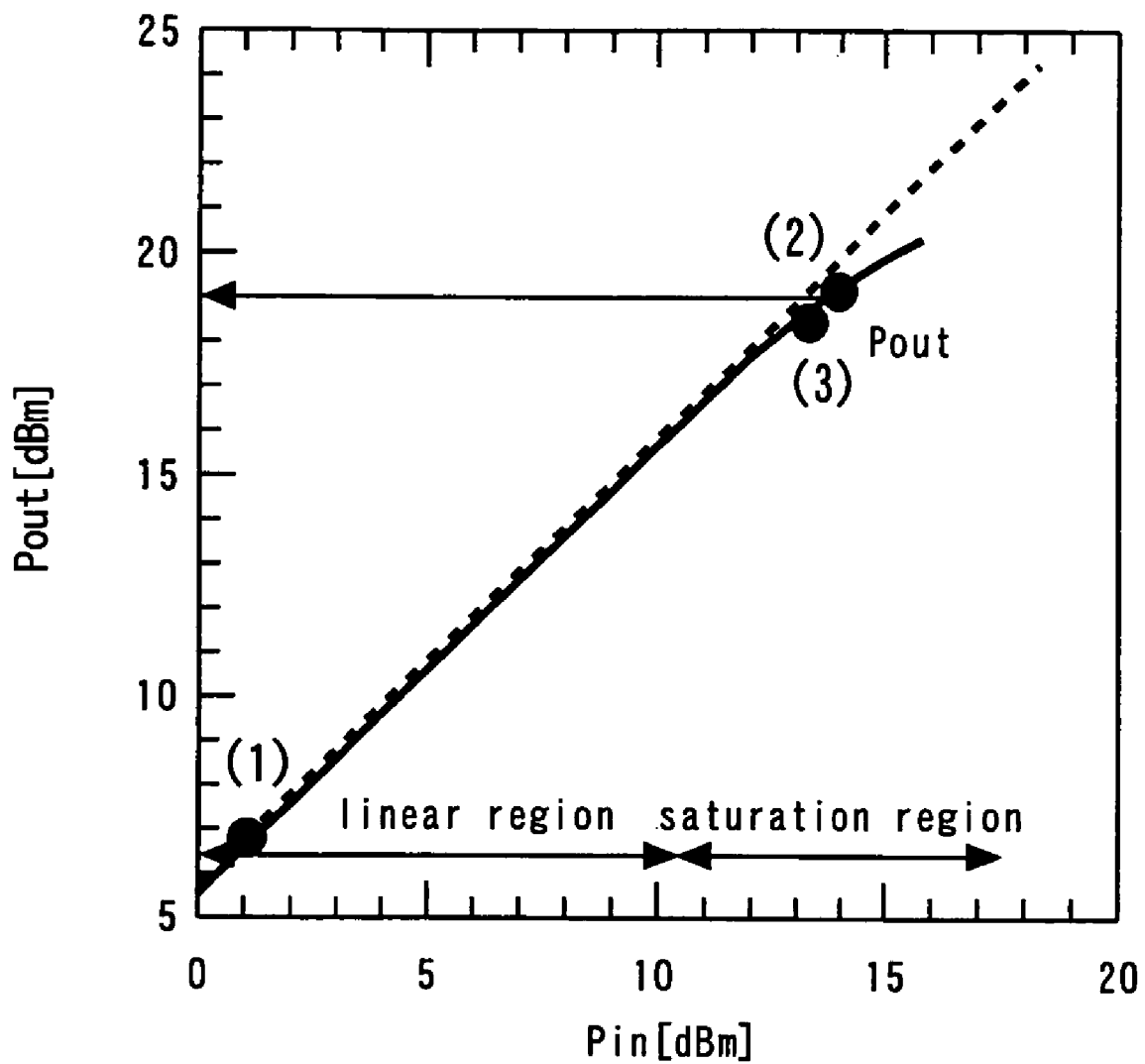
FIG. 12 is a diagram showing the relationship between input power $P_{in}$ input to an amplifier and output power $P_{out}$ from the amplifier.
Figure 13:
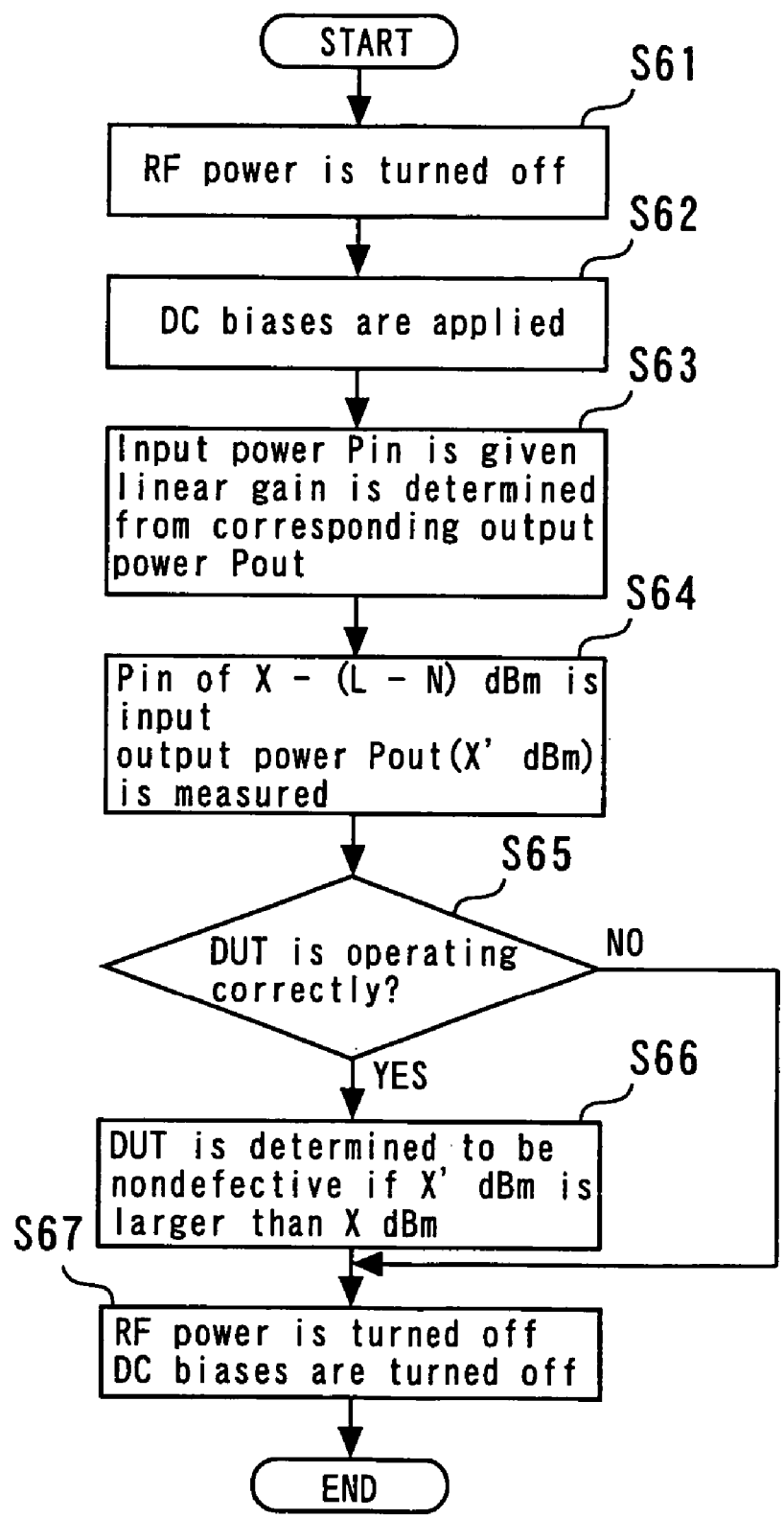
FIG. 13 is a flowchart showing a semiconductor device inspection method according to a fifth embodiment of the present invention.

FIG. 12 is a diagram showing the relationship between input power $P_{in}$ input to an amplifier and output power $P_{out}$ from the amplifier. FIG. 13 is a flowchart showing a semiconductor device inspection method according to a fifth embodiment of the present invention.

In the inspection method according to this embodiment, RF power is first turned off (step S61) and DC biases are applied (step S62). Input power $P_{in}$ (A dB) which is certainly within a linear region is then given and a linear gain L=(B−A) dB is determined from the corresponding output power $P_{out}$ (B dB) (step S63).

Input power $P_{in}$ of X−(L−N) dBm is next input and output power $P_{out}$ (X'dBm) is measured (step S64). Examination is then made as to whether or not the DUT is operating correctly (step S65). If the DUT is operating correctly, the process advances to step S66. If the DUT is not operating correctly, the process moves to step S67.

The device is determined to be nondefective if the actually measured value X' dBm of output power $P_{out}$ is larger than a standard value X dBm (step S66). The RF power is thereafter turned off, the DC biases are turned off and the inspection process ends (step S67).

In the above-described inspection method, the power gain is X'−(X−(L−N))=X'−X+L−N, and the amount of gain compression (linear gain−power gain) is L−(X'−(X−(L−N)))=X−X'+N. That is, the amount of gain compression<N if X'>X, the amount of gain compression>N if X'<X.

This inspection method does enable quantitative determination of the N dB gain compression point output ($P_{NdB}$). However, as can also be understood from FIG. 12, the amount of gain compression increases monotonously with the increase in input power. Therefore, if the amount of gain compression is smaller than N at this point in time, the $P_{NdB}$ must be higher than X. Conversely, if the amount of gain compressing is larger than N, $P_{NdB}$ is lower than X. That is, by measuring input/output characteristics at only two points, determination can be made as to whether or not $P_{NdB}$ is higher than X.

Figure 14:
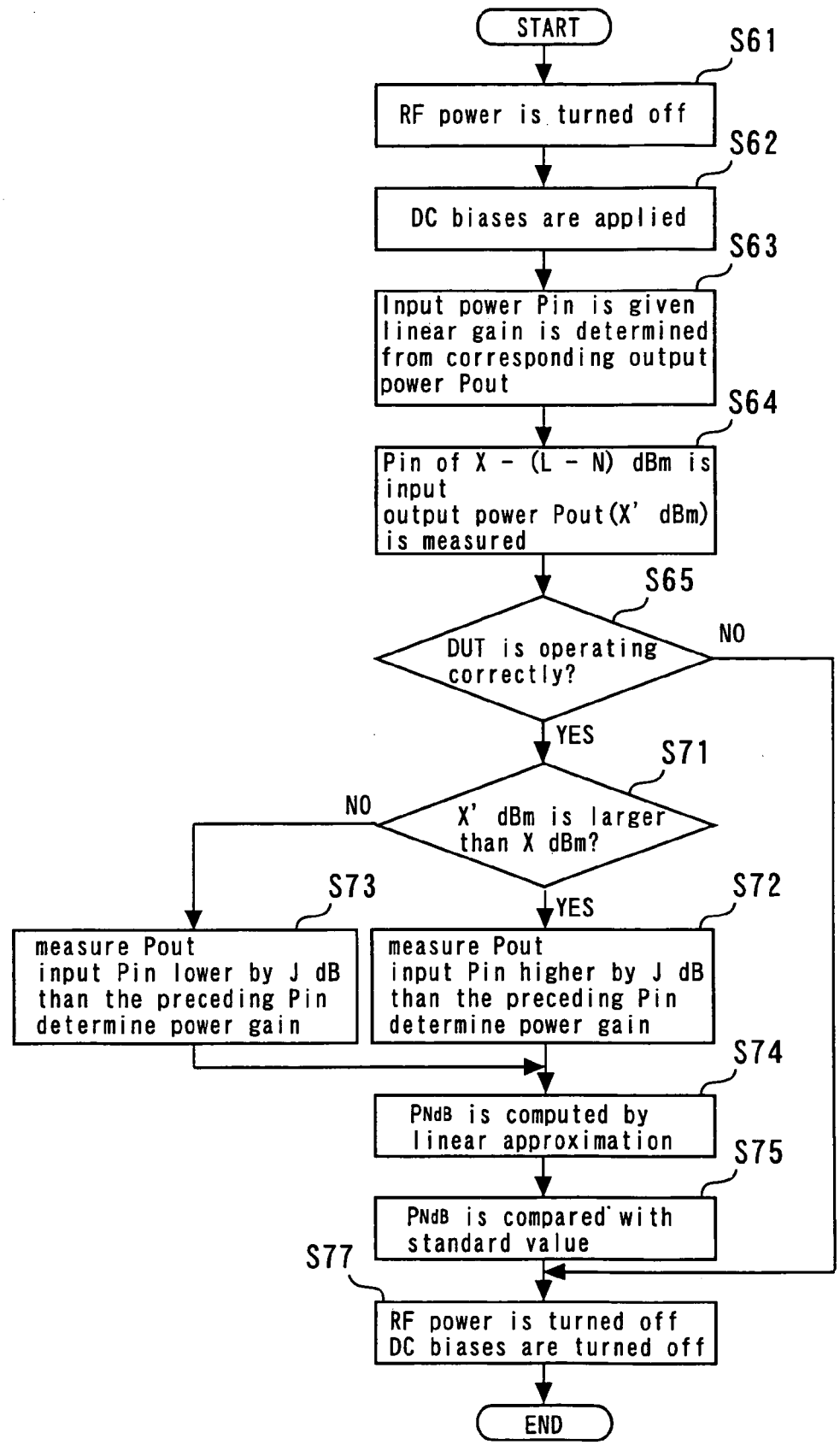
FIG. 14 is a flowchart showing a semiconductor device inspection method which quantitatively determines the N dB gain compression point output ($P_{NdB}$) according to the fifth embodiment of the present invention.
Figure 15:
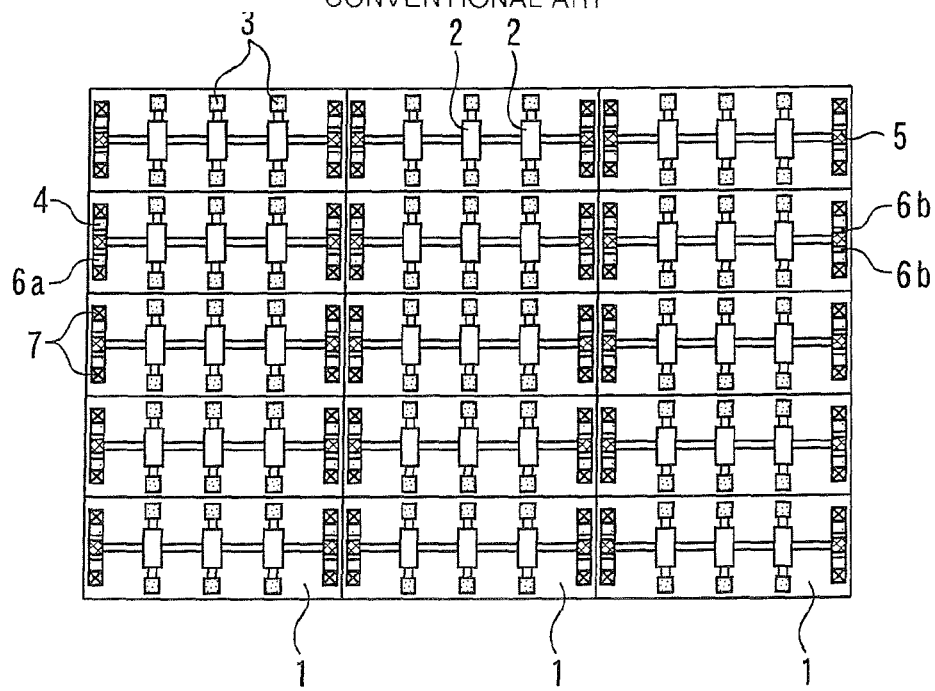
FIG. 15 is a plan view showing a conventional layout of chip patterns formed on a wafer.
Figure 16:
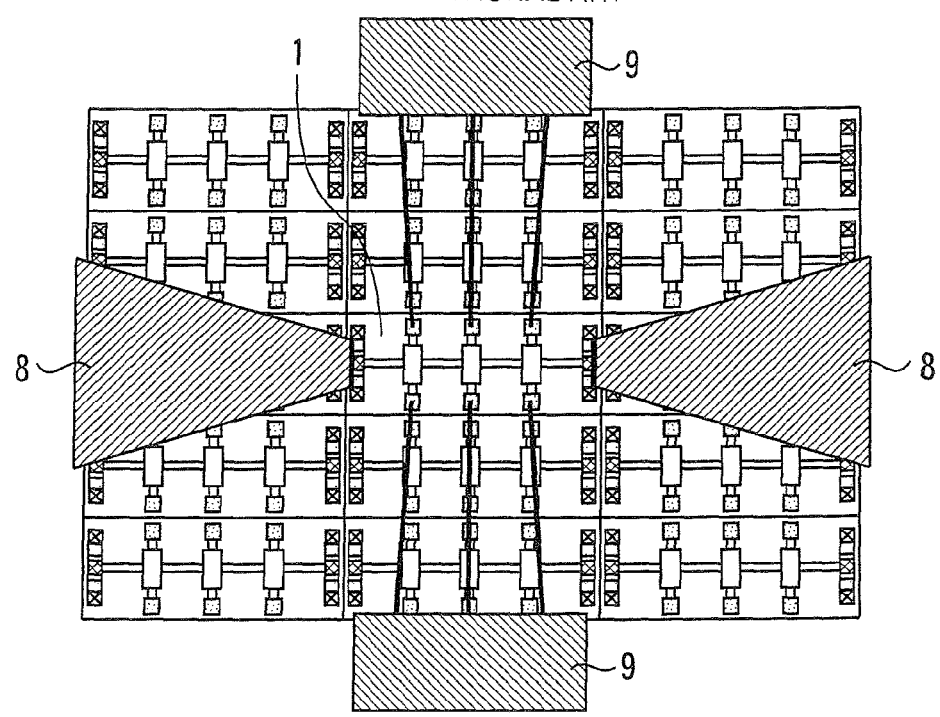
FIG. 16 is a plan view showing a state when a one hundred percent inspection of the layout shown in FIG. 15 is started.
Figure 17:
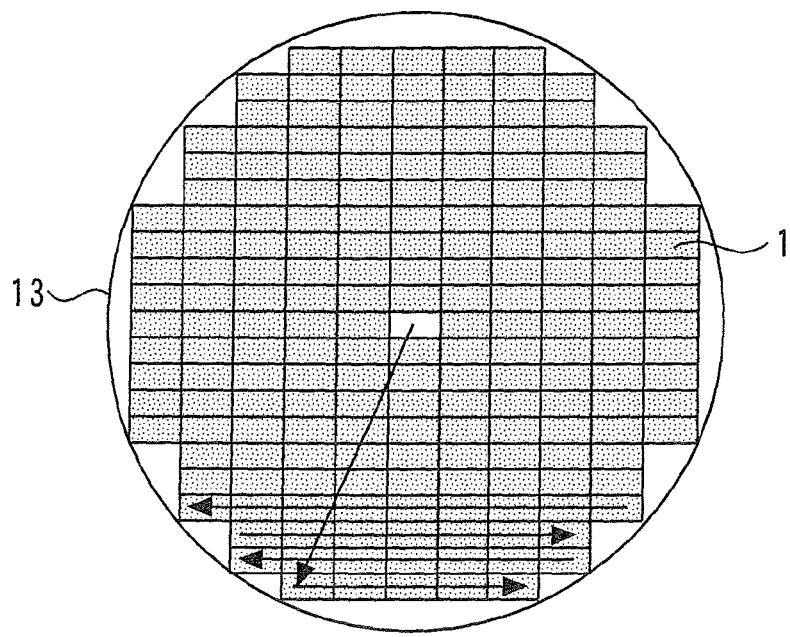
FIG. 17 is a plan view showing the movement of the inspection position in a conventional method of one hundred percent inspection of high-frequency characteristics.
Figure 18:
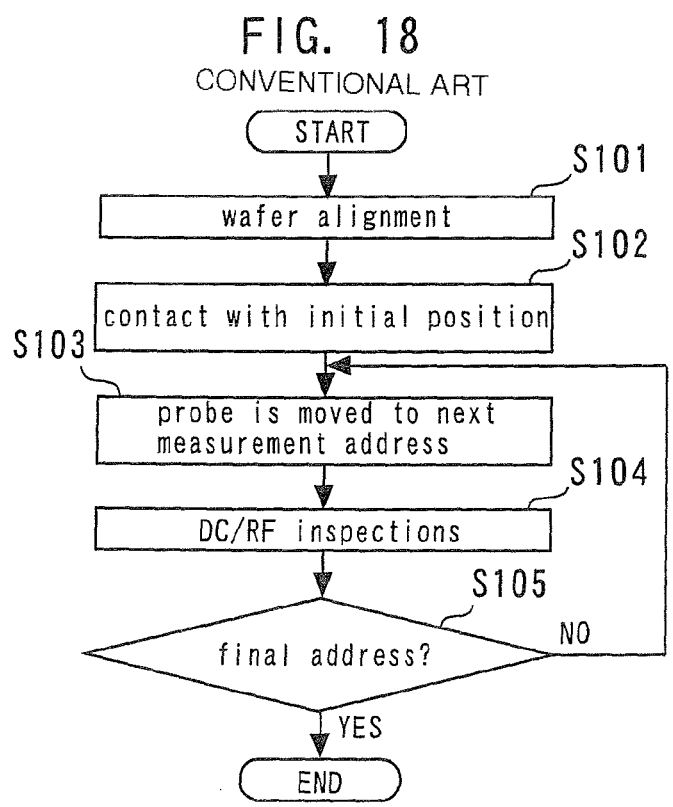
FIG. 18 is a flowchart showing a conventional on-wafer one hundred percent inspection method.
Figure 19:
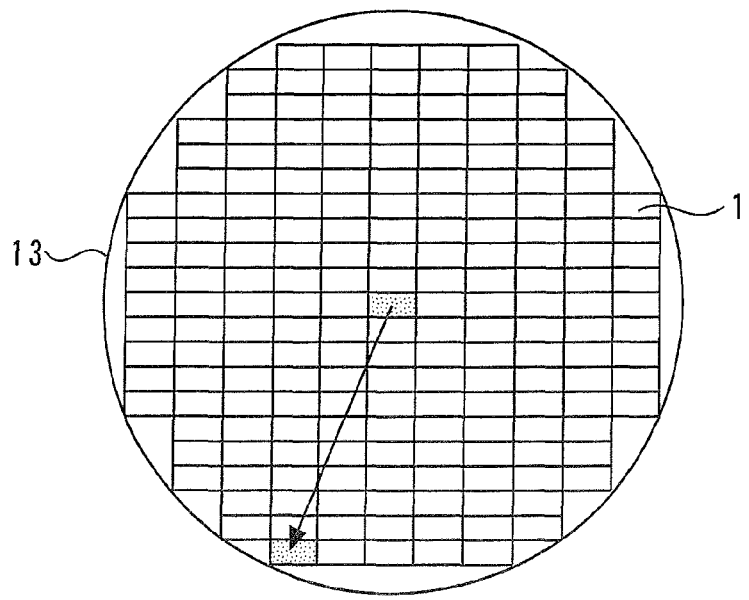
FIG. 19 is a plan view showing the movement of the inspection position in a conventional method of one hundred percent inspection of high-frequency characteristics with respect to temperature.
Figure 20:
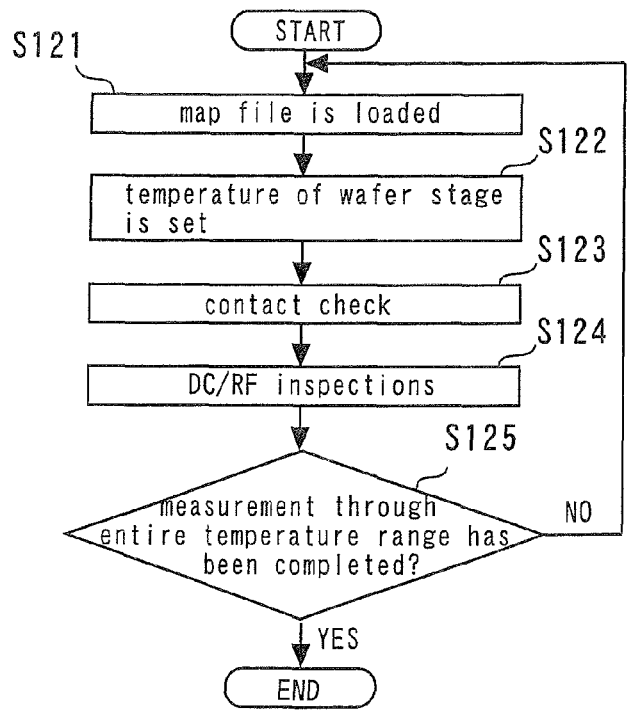
FIG. 20 is a flowchart showing the conventional method of one hundred percent inspection of high-frequency characteristics with respect to temperature.
Figure 21:
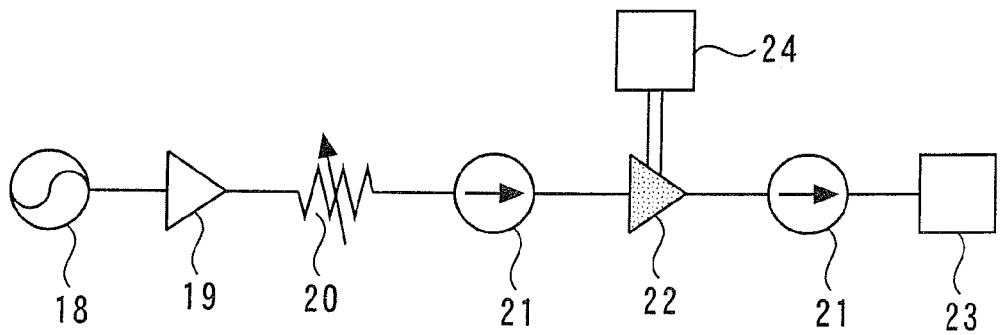
FIG. 21 is a diagram schematically showing a conventional RF energization inspection system.
Figure 22:
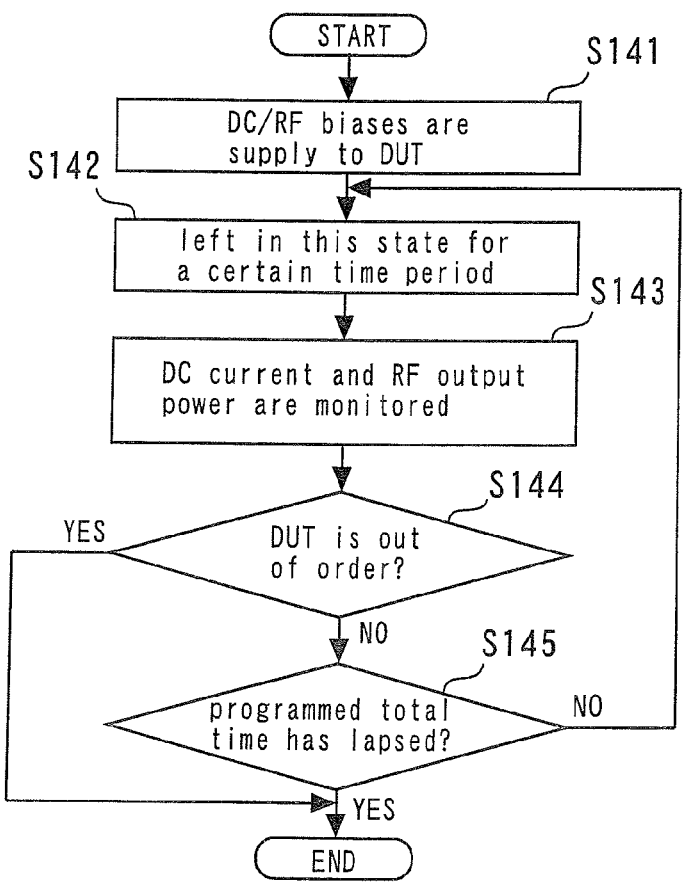
FIG. 22 is a flowchart showing a conventional RF energization inspection method in which an RF output measurement interrupt is produced at certain intervals.
Figure 23:
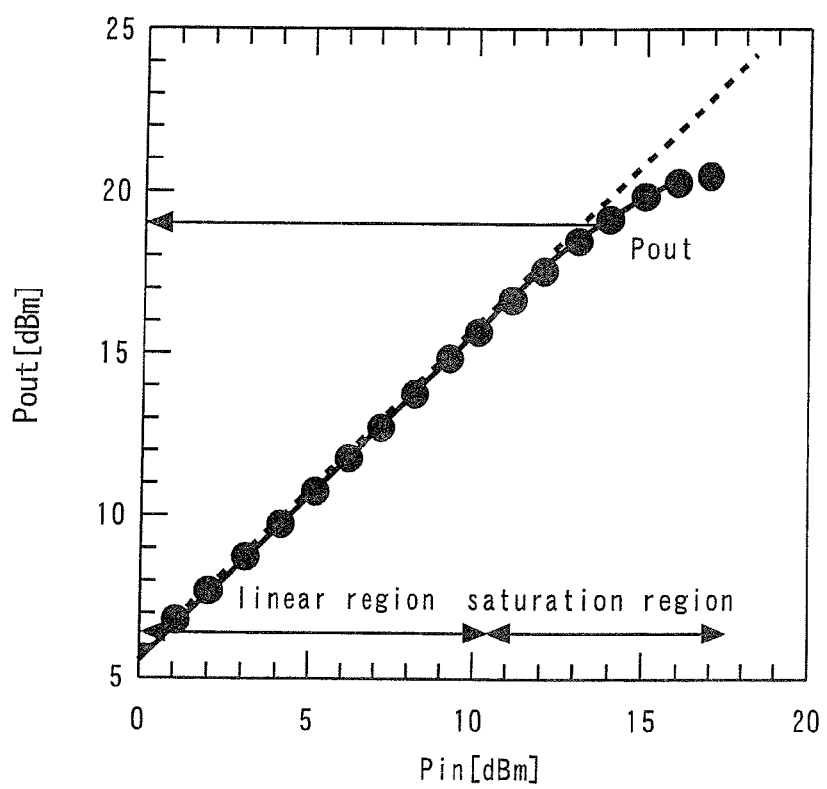
FIG. 23 is a diagram showing input power $P_{in}$ and output power $P_{out}$ of the amplifier.
Figure 24:
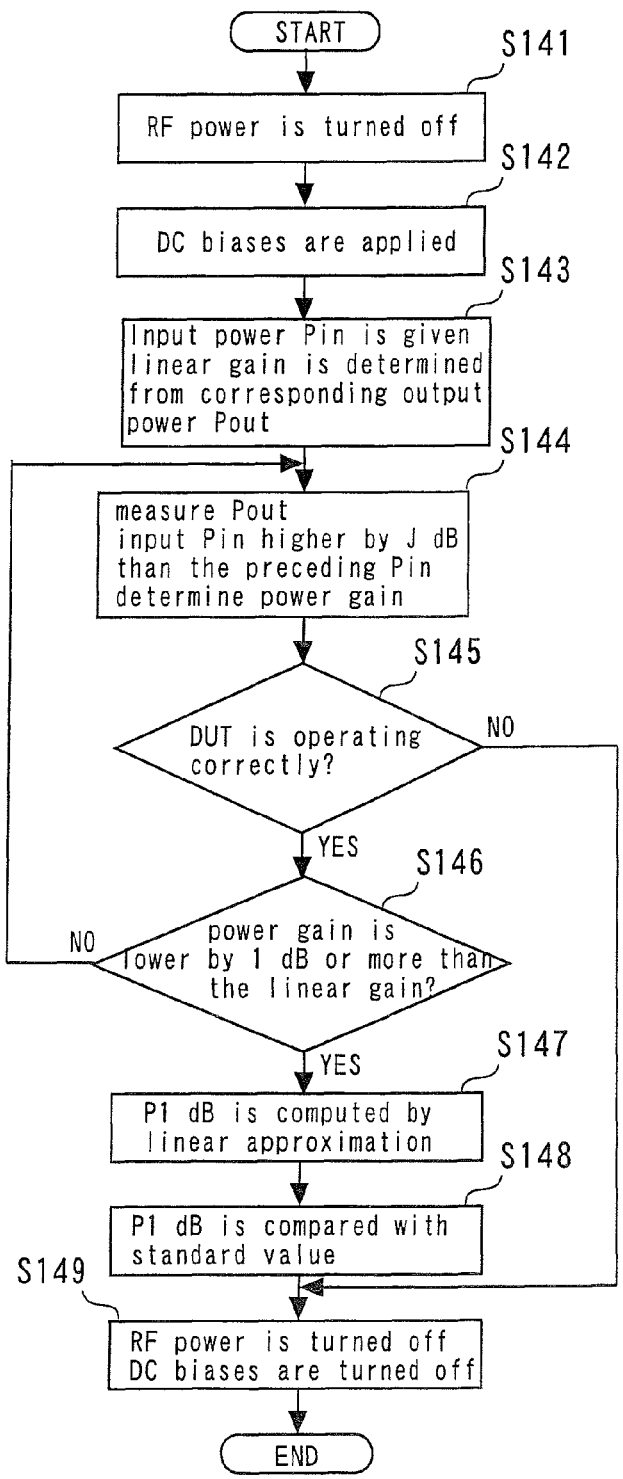
FIG. 24 is a flowchart showing a conventional N dB gain compression point output inspection method.

FIG. 14 is a flowchart showing a semiconductor device inspection method which quantitatively determines the N dB gain compression point output ($P_{NdB}$) according to the fifth embodiment of the present invention. Steps S61 to S75, and S77 are the same as those of the above-described inspection method, but this method differs from the above-described method in that output power $P_{out}$ is measured by inputting input power $P_{in}$ shifted by ±dB according to whether or not X'>X. J is a constant value and is, preferably, 0.5 to 3 dB in ordinary cases.

More specifically, determination is made as to whether or not the actually measured value X'dBm of output power $P_{out}$ is larger than the standard value X dBm (step S71). If X'>X, output power $P_{out}$ is measured by inputting input power $P_{in}$ higher by J dB than the preceding input power $P_{in}$ to determine the power gain (step S72). If X'<X, output power $P_{out}$ is measured by inputting input power $P_{in}$ lower by J dB than the preceding input power $P_{in}$ to determine the power gain (step S73).

The N dB gain compression point output ($P_{NdB}$) is thereafter computed by linear approximation or input power $P_{in}$ step-down adjustment (step S74). Determination of the computed N dB gain compression point output by comparison with the standard value is then made (step S75). Thereafter, the RF power is turned off, the DC biases are turned off and the inspection process ends (step S67).

Thus, the NdB gain compression point output ($P_{NdB}$) can be computed by linear interpolation using data at the third point or by further level step-down adjustment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-321510, filed on Nov. 4, 2005 including specification, claims, drawings and summary, on which the Convention priority of the present application is based, are incorporated herein by reference in its entirety.

What is claimed is:

1. A method of inspecting semiconductor device chip patterns on a wafer, the method comprising:
   providing on a wafer, in an orderly layout,
      a plurality of identical chip patterns, each chip pattern including a transistor element, a DC bias application pad, a radio frequency input pad, a radio frequency output pad, and a grounding pad, and
      a plurality of check patterns identical in shape and size to the chip patterns, the check patterns being arranged within the orderly layout of the chip patterns, each check pattern including pads arranged within the check pattern in the same arrangement as the DC bias application pad, the radio frequency input pad, the radio frequency output pad, and the grounding pad of the chip patterns, and further including a transmission line connecting the radio frequency input pad to the radio frequency output pad;
   inspecting at least one of the check patterns by applying radio frequency probes of a radio frequency probe head to the radio frequency input pad and the radio frequency output pad, and applying DC probes of a DC probe card to the DC bias application pad and the grounding pad, and applying electrical signals to the radio frequency probes and the DC probes to inspect the check pattern; and
   determining whether results of inspecting the at least one of the check patterns are within predetermined ranges, and,
      if the results are within the predetermined ranges, inspecting at least one of the chip patterns by applying the radio frequency probes to the radio frequency input pad and the radio frequency output pad of a chip pattern, applying the DC probes to the bias application pad and the grounding pad of the chip pattern, and applying electrical signals to the radio frequency probes and the DC probes to inspect the chip pattern, and, if the results and not within the predetermined ranges, reestablishing contact between the radio frequency probes and the DC probes and the check pattern, and repeating the inspecting of the at least one of the check patterns.

2. The method of inspecting semiconductor device chip patterns on a wafer according to claim 1, further comprising, after determining that the results of inspecting at least one of the check patterns are within the predetermined ranges, inspecting all of the chip patterns on the wafer.

3. The method of inspecting semiconductor device chip patterns on a wafer according to claim 2, further comprising, after inspecting all of the chip patterns on the wafer, repeating inspection of at least one of the check patterns, and, if the results of inspecting the at least one check pattern after inspecting all of the chip patterns are within the predetermined ranges, ending inspection of the chip patterns, and if the results of inspecting the at least one check pattern after inspecting all of the chip patterns are not within the predetermined ranges, ending inspection of the chip patterns, reestablishing contact between the radio frequency probes and the DC probes and the check pattern, and repeating the inspecting of the at least one of the check patterns.

* * * * *